(12) United States Patent
Matsuda et al.

(10) Patent No.: US 10,260,727 B2
(45) Date of Patent: Apr. 16, 2019

(54) LIGHT-EMITTING DEVICE HAVING CERAMIC MATERIALS FOR IMPROVING PERFORMANCE THEREOF

(71) Applicant: SHARP KABUSHIKI KAISHA, Sakai, Osaka (JP)

(72) Inventors: Makoto Matsuda, Sakai (JP); Makoto Agatani, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 654 days.

(21) Appl. No.: 14/892,071

(22) PCT Filed: Jun. 9, 2014

(86) PCT No.: PCT/JP2014/065188
§ 371 (c)(1),
(2) Date: Nov. 18, 2015

(87) PCT Pub. No.: WO2015/008555
PCT Pub. Date: Jan. 22, 2015

(65) Prior Publication Data
US 2016/0091191 A1    Mar. 31, 2016

(30) Foreign Application Priority Data

Jul. 19, 2013   (JP) ................................ 2013-150900
Feb. 21, 2014   (JP) ................................ 2014-032136

(51) Int. Cl.
*F21V 29/70*    (2015.01)
*F21V 19/00*    (2006.01)
(Continued)

(52) U.S. Cl.
CPC ............ *F21V 29/70* (2015.01); *F21V 19/004* (2013.01); *F21V 19/0055* (2013.01); *F21V 23/06* (2013.01); *H01L 33/64* (2013.01); *F21Y 2105/10* (2016.08); *F21Y 2115/10* (2016.08); *H01L 25/0753* (2013.01);
(Continued)

(58) Field of Classification Search
CPC ....... F21V 29/70; F21V 19/0055; F21V 23/06
See application file for complete search history.

(56) References Cited

U.S. PATENT DOCUMENTS

2006/0141851 A1   6/2006  Matsui et al.
2009/0184330 A1   7/2009  Okimura
2012/0188763 A1   7/2012  Yamakawa et al.

FOREIGN PATENT DOCUMENTS

JP    2004-265619    9/2004
JP    2006-310138    11/2006
(Continued)

OTHER PUBLICATIONS

International Search Report for PCT/JP2014/065188 dated Sep. 2, 2014, 4 pages.
(Continued)

*Primary Examiner* — Joseph L Williams
(74) *Attorney, Agent, or Firm* — ScienBiziP, P.C.

(57) ABSTRACT

A light-emitting device (100) is provided with: a light-emitting module (1) in which a light-emitting section (30) is provided on a ceramic substrate (11); a heat sink (2); a holder (4) having a ceramic plate (50) for attaching the light-emitting module (1) to the heat sink (2); and a heat-dissipating sheet (3) provided between the ceramic substrate (11) and the heat sink (2).

8 Claims, 8 Drawing Sheets

(51) Int. Cl.
  *F21V 23/06* (2006.01)
  *H01L 33/64* (2010.01)
  *H01L 25/075* (2006.01)
  *F21Y 105/10* (2016.01)
  *F21Y 115/10* (2016.01)

(52) U.S. Cl.
  CPC .. *H01L 33/644* (2013.01); *H01L 2224/45144* (2013.01); *H01L 2224/48091* (2013.01); *H01L 2224/48137* (2013.01)

(56) References Cited

FOREIGN PATENT DOCUMENTS

| | | |
|---|---|---|
| JP | 2008-218224 | 9/2008 |
| JP | 2009-176809 | 8/2009 |
| JP | 2009-289841 | 12/2009 |
| JP | 2011-199055 | 10/2011 |
| JP | 2012-109405 | 6/2012 |

OTHER PUBLICATIONS

International Preliminary Report on Patentability for PCT/JP2014/065188 dated Apr. 27, 2015, 11 pages.

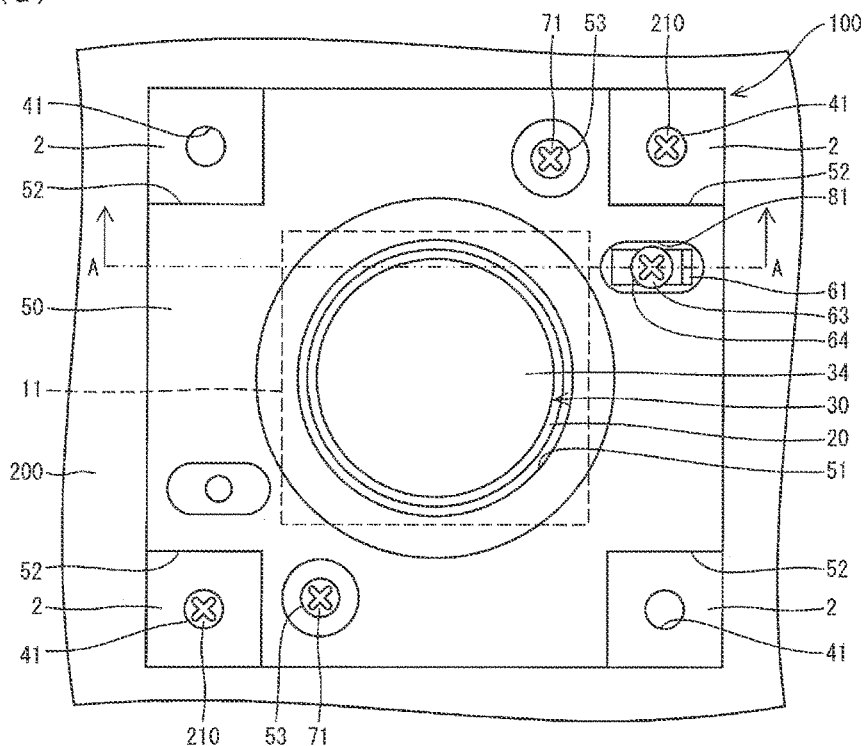

(b)

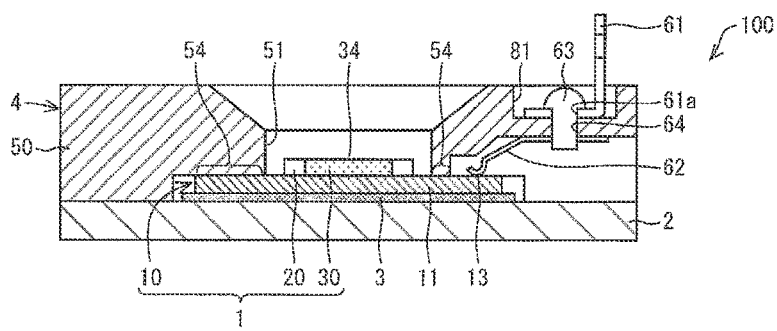

| 1: LIGHT-EMITTING MODULE | 52: CUTOUT SECTION |
| 2: HEAT SINK | 53: SCREW HOLE |
| 3: HEAT-DISSIPATING SHEET | 54: CONTACT SECTION |
| 4: HOLDER | 61: CONNECTION PIN SECTION |
| 10: WIRING SUBSTRATE | 61a: OPENING |
| 11: CERAMIC SUBSTRATE | 62: CONDUCTIVE CONTACT SECTION |
| 13: LAND ELECTRODE | 63: SCREW |
| 20: RESIN DAM | 64: SCREW HOLE |
| 30: LIGHT-EMITTING SECTION | 71: SCREW |
| 34: LIGHT-EMITTING SURFACE | 81: GROOVE SECTION |
| 41: SCREW HOLE | 100: LIGHT-EMITTING DEVICE |
| 50: CERAMIC PLATE | 200: EXTERNAL DEVICE |
| 51: LIGHT-EMITTING SURFACE OPENING | 210: SCREW |

4: HOLDER
50: CERAMIC PLATE
51: LIGHT-EMITTING SURFACE OPENING
61: CONNECTION PIN SECTION
61a: OPENING
62: CONDUCTIVE CONTACT SECTION
63: SCREW
64: SCREW HOLE
81: GROOVE SECTION

US 10,260,727 B2

LIGHT-EMITTING DEVICE HAVING CERAMIC MATERIALS FOR IMPROVING PERFORMANCE THEREOF

This application is the U.S. national phase of International Application No. PCT/JP2014/065188 filed 9 Jun. 2014 which designated the U.S. and claims priority to JP Patent Application No. 2013-150900 filed 19 Jul. 2013 and JP Patent Application No. 2014-032136 filed 21 Feb. 2014, the entire contents of each of which are hereby incorporated by reference.

TECHNICAL FIELD

The present invention relates to a light-emitting device provided with: a light-emitting module in which a light-emitting section is provided on a substrate; and a holder for attaching the light-emitting module to a heat sink.

BACKGROUND ART

In general, resin-made substrates and metal substrates are used for substrates that have light-emitting elements placed thereon and are used in light-emitting devices (for example, see PTL 1 and 2).

CITATION LIST

Patent Literature

PTL 1: Japanese Unexamined Patent Application Publication, "Japanese Unexamined Patent Application Publication No. 2006-310138 (published on Nov. 9, 2006)"

PTL 2: Japanese Unexamined Patent Application Publication, "Japanese Unexamined Patent Application Publication No. 2004-265619 (published on Sep. 24, 2004)"

SUMMARY OF INVENTION

Technical Problem

However, when a resin-made substrate is used for a substrate that has light-emitting elements placed thereon, there is a problem in that the substrate is liable to discolor and degenerate due to temperature and light.

Furthermore, when a metal substrate is used for a substrate that has light-emitting elements placed thereon, an insulator for forming wiring for implementing light-emitting elements arranged on the substrate and an electrical connection with outside of the substrate is required.

It should be noted that PTL 1 discloses that, in a substrate comprising an insulating layer made of a resin member and a heat-conducting plate made of a metal layer, a ceramic material and a resin material may be used instead of metal for the heat-conducting plate as a modified example. Furthermore, it is disclosed that it is desirable for the insulating layer to also be ceramic in the case where a ceramic material is used in the heat-conducting plate.

A ceramic substrate does not discolor/degenerate due to temperature and light compared to a general resin-made printed substrate. Furthermore, with a ceramic substrate, an insulator for forming wiring for implementing light-emitting elements arranged on the substrate and an electrical connection with outside of the substrate is not required. Thus, a ceramic substrate does not have the aforementioned problems and has high long-term reliability. Furthermore, a ceramic substrate has a high dielectric breakdown voltage when compared to a metal substrate.

Consequently, a ceramic substrate is suitable as a substrate in an illumination device in which long-term reliability is viewed as important and also the lowest dielectric breakdown voltage value is determined by standards in various countries.

However, a feature of ceramic is low toughness, and it is therefore possible that breakage due to stress may occur.

In general, the user appropriately selects a method for fixing, to a heat sink, a substrate on which light-emitting elements are placed, which is conventionally used as a light-emitting device.

A resin-made holder is often used as a method for fixing a light-emitting device. Ordinarily, the holder is fixed to the heat sink with screws.

However, depending on the user, various screw torques are generated when the sink and the holder are fixed. Thus, when a resin-made holder is used to fix the light-emitting device to the heat sink, a situation is liable to occur in which the holder bends due to screw stress and excess stress is loaded on the light-emitting device, which, in the worst case, leads to breakage of the light-emitting device.

Furthermore, there is a problem in that a resin-made holder discolors/degenerates when exposed to light from the light-emitting device for a long period of time, which consequently causes a decline in reflectance.

Thus, it is necessary for a resin-made holder to be a structure that is positioned away from the light-emitting section of the light-emitting device where there is a high possibility of being exposed to light.

It should be noted that there are also cases where a metal-made holder is used as in PTL 1 and 2. However, wiring and electrodes are provided on the front surface of a substrate on which light-emitting elements are placed, and therefore, in order to ensure insulation between the holder and the wiring and electrodes, it is necessary to arrange an insulator between the holder and the light-emitting device, for example, and there is concern that the device may become complex and that the device may become large. Furthermore, because the region in which the holder and the substrate can be brought into contact is extremely limited, it is difficult to suitably apply a force with which the substrate holds the heat sink down. Thus, in the case where a heat-dissipating material is provided between the light-emitting device and the heat sink, the adhesion of the heat-dissipating material becomes an issue.

In the case where a heat-dissipating material is provided between a light-emitting device and a heat sink in order to improve heat dissipation, the heat-dissipating material is appropriately selected by the user.

For example, grease, an adhesive, a sheet, or the like having high heat dissipation properties is selected as the heat-dissipating material. However, with grease or an adhesive, material management and stabilization of the application step are difficult. Thus, a sheet is often selected.

However, the ability to follow the front surface of the heat sink and the rear surface of the light-emitting device is low with a sheet compared to grease or an adhesive. Thus, gaps are liable to occur and a rise in thermal resistance is liable to be caused. Thus, when this kind of light-emitting device is used for an illumination device, an excessive rise in temperature occurs, which, in the worst case, leads to a lighting failure of the illumination device.

Furthermore, as a separate problem from the aforementioned, in the case where, for example, a screw is used as a connection section between the light-emitting module and the outside, there is a risk of satisfactory fixing of the connection section no longer being possible if the screw becomes caught on something and makes erroneous contact.

The present invention takes each of the aforementioned problems into consideration, and realizes a light-emitting device having excellent reliability with which each of the aforementioned problems can be solved.

Solution to Problem

Furthermore, in order to solve the aforementioned problems, a light-emitting device according to an aspect of the present invention is provided with: a light-emitting module in which a light-emitting section is provided on a substrate; and a holder for attaching the light-emitting module to a heat sink, there being at least one groove section in a portion of a front surface of the holder, a connection section that electrically connects the light-emitting module to outside being provided within the groove section, the connection section being provided with: a connector that is connected to the outside; and a screw that fixes the connector to the holder, and also electrically connects the connector to a power-supply electrode section in the light-emitting module, a conductive contact section being further provided, electrically connected to the power-supply electrode section due to being provided in a position that opposes the groove section in a rear surface of the holder and being superimposed on the power-supply electrode section in a vertically opposing manner, and also electrically connected to the connector by the screw, and the groove section being formed so as to be able to accommodate a portion of an external conducting wire or wiring that is electrically connected to the conductive contact section by way of the connection section.

Advantageous Effects of Invention

According to an aspect of the present invention, by using a ceramic substrate for the aforementioned substrate, deformation of the substrate can be suppressed, and also the insulation properties of the substrate can be easily ensured. Furthermore, due to the main body of the holder (holder main body) being formed of ceramic, the holder main body does not deform, and the ceramic substrate does not break due to deformation of the holder.

Furthermore, ceramic exhibits very little expansion/contraction due to thermal changes. Thus, due to the substrate and the main body of the holder being formed of ceramic, it is possible to suppress both expansion/contraction of the substrate and expansion/contraction of the holder main body caused by heat.

Furthermore, due to the holder main body being formed of ceramic, it is possible to prevent discoloration/degeneration of the holder and a decline in reflectance. Thus, the holder can be positioned in the vicinity of the light-emitting section, and therefore the rear surface of the light-emitting section, which is a heat generation source, can be suitably adhered to the heat-dissipating sheet. Thus, when the light-emitting device is used for an illumination device, it is possible to obtain an illumination device in which a lighting failure caused by an excessive rise in temperature does not occur.

In addition, due to the substrate and the holder main body each being formed of ceramic, a heat dissipation path for heat generated from the light-emitting section can be provided not only at the heat sink side but also at the holder side.

Furthermore, due to the heat-dissipating sheet being provided between the substrate and the holder, it is possible to improve heat dissipation, and it is also possible to facilitate material management and achieve stabilization of the application step compared to the case where grease or an adhesive is used as a heat-dissipating material.

Thus, as previously mentioned, due to the heat-dissipating sheet being provided between the substrate and the heat sink, and also the substrate and the main body of the holder being formed of ceramic, it is possible to realize a light-emitting device having good heat dissipation properties and excellent reliability.

Furthermore, according to an aspect of the present invention, due to at least one groove section being provided in a portion of the front surface of the holder, and a connection section that electrically connects the light-emitting module to the outside being provided within the groove section, it is possible to suppress or prevent the connection section protruding further upward than the sidewalls of the groove section.

In this case, a satisfactory appearance can be achieved. Furthermore, it is possible to mitigate or prevent the connection section being caught on something and making erroneous contact, and to also implement satisfactory fixing. Furthermore, usability can be improved.

Consequently, as previously mentioned, due to at least one groove section being provided in a portion of the front surface of the holder, and the connection section being provided within the groove section, it is possible to realize a light-emitting device having excellent reliability.

BRIEF DESCRIPTION OF DRAWINGS

FIG. 1(a) is a plan view depicting a schematic configuration of when a light-emitting device according to embodiment 1 is placed on an external device, and (b) is a cross-sectional view along line A-A of the light-emitting device depicted in (a).

DESCRIPTION OF EMBODIMENTS

Figure 2:
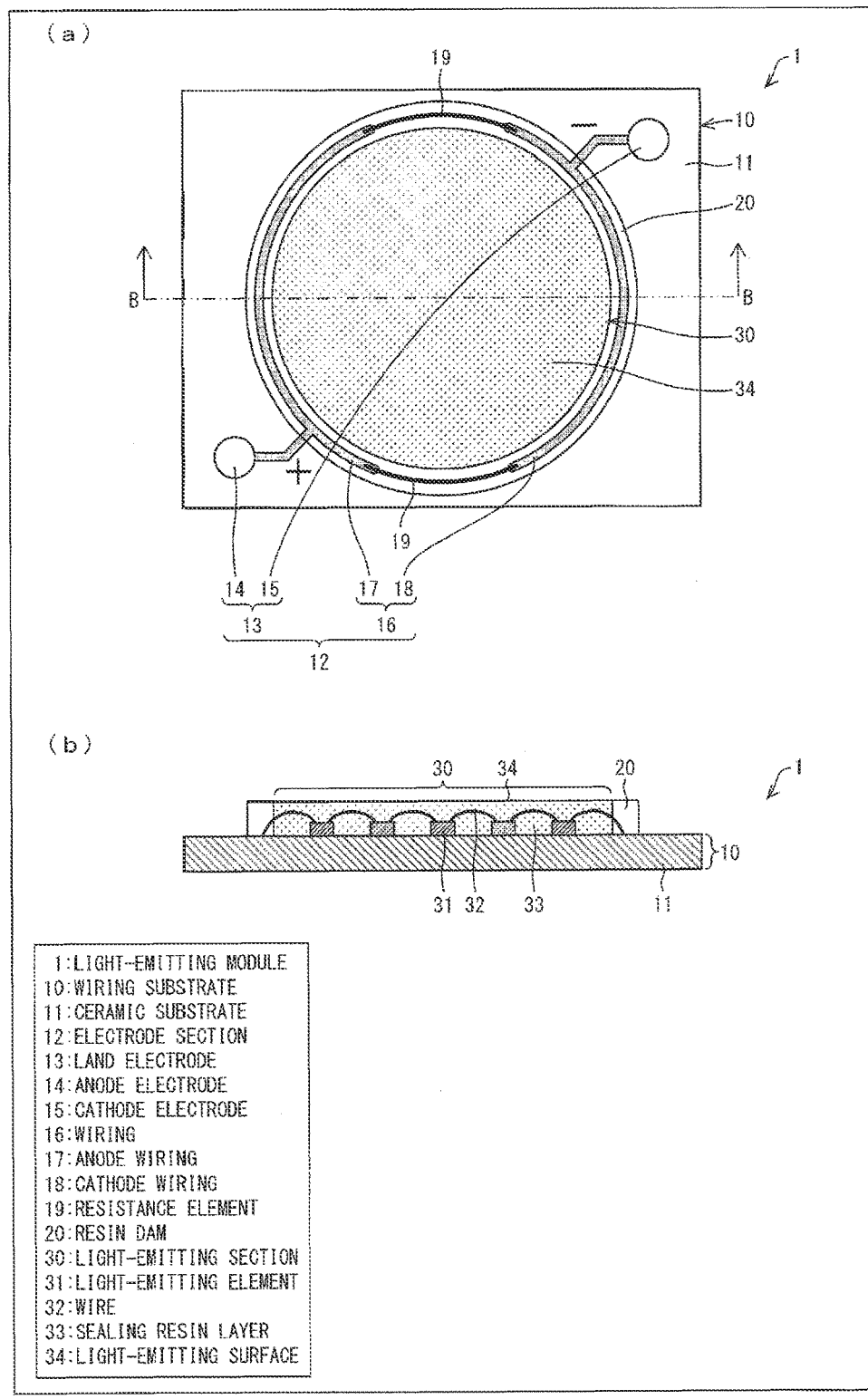
FIG. 2(a) is a plan view depicting a schematic configuration of a light-emitting module according to embodiment 1, and (b) is a cross-sectional view along line B-B of the light-emitting module depicted in (a).

Hereinafter, embodiments of the present invention will be described in detail.

Embodiment 1

If an embodiment of the present invention were to be described on the basis of FIGS. 1(a) and (b) to FIG. 3, it would be as follows.

FIG. 1(a) is a plan view depicting a schematic configuration of when a light-emitting device 100 according to the present embodiment is placed on an external device 200, and FIG. 1(b) is a cross-sectional view along line A-A of the light-emitting device 100 depicted in FIG. 1(a).

It should be noted that a description is given hereinafter with the active surface (mounting surface) side of a light-emitting module 1 in the light-emitting device 100 serving as the front surface side and the opposite side to the active surface serving as the rear surface side.

Furthermore, in the following description, specific dimensions and shapes are described as examples with respect to some constituent elements for reference. However, these specific dimensions and shapes are appropriately set in accordance with the use and so forth of the light-emitting device 100 and are merely examples. The present embodiment is not limited to these specific dimensions and shapes.

<<Schematic Configuration of Light-Emitting Device 100>>

As depicted in FIGS. 1(a) and (b), the light-emitting device 100 according to the present embodiment is provided with the light-emitting module 1, a heat sink 2, a heat-dissipating sheet 3, and a holder 4. The light-emitting module 1, the heat-dissipating sheet 3, and the holder 4 are provided on the heat sink 2.

In the present embodiment, as an example, a case is described in which the heat sink 2 and the holder 4 have a square external shape in plan view and a light-emitting section 30 of the light-emitting module 1 has a circular external shape in plan view; however, it should be noted that the present embodiment is not limited thereto.

<<Schematic Configuration of Light-Emitting Module 1>>

FIG. 2(a) is a plan view depicting a schematic configuration of the light-emitting module 1, and FIG. 2(b) is a cross-sectional view along line B-B of the light-emitting module 1 depicted in FIG. 2(a).

As depicted in FIGS. 2(a) and (b), the light-emitting module 1 is provided with a wiring substrate 10, and a resin dam 20 and the light-emitting section 30 that are provided on the wiring substrate 10.

<Schematic Configuration of Wiring Substrate 10>

The wiring substrate 10 has a configuration in which an electronic circuit such as an electrode section 12 is provided on the front surface of a ceramic substrate 11. It should be noted that resistance elements 19 may be provided on the front surface of the ceramic substrate 11 as depicted in FIG. 2(a).

(Ceramic Substrate 11)

In the present embodiment, a substrate that comprises ceramic, is 24 mm×30 mm, is 1-mm thick, and has a rectangular shape in plan view is used for the ceramic substrate 11.

Ceramic has high rigidity and does not bend due to external stress. Furthermore, ceramic has a high dielectric breakdown voltage. When these two items are compared to those of resin and metal, ceramic is the most superior.

Furthermore, ceramic has electrical insulation properties, high light reflectivity, and high thermal conductivity. By using ceramic for the wiring substrate 10 of the light-emitting module 1, heat generated by the light-emitting section 30 can be released to the heat-dissipating sheet 3 and the heat sink 2 via the ceramic substrate 11. Furthermore, light that has leaked from the light-emitting section 30 in the direction of the ceramic substrate 11 can be reflected by the ceramic substrate 11.

In addition, generally, a ceramic substrate (in other words, a ceramic-made substrate) does not discolor/degenerate and so forth due to temperature and light compared to a general resin-made printed substrate. Furthermore, with a ceramic substrate, an insulator for forming wiring for implementing light-emitting elements arranged on the substrate and an electrical connection with outside of the substrate is not required as in the case where a metal substrate is used. Furthermore, such an insulator is generally made of resin, and therefore the problem of discoloration/degeneration or the like caused by temperature and light that becomes a problem when such an insulator is used also does not occur. In addition, compared to a metal substrate, there is the benefit that the dielectric breakdown voltage is high.

It should be noted that the ceramic used for the ceramic substrate 11 according to the present embodiment is not particularly limited. A possible example is zirconia-based ceramic or the like, which is excellent in terms of electrical insulation properties, high light reflectivity, and high thermal conductivity.

(Electrode Section 12)

As depicted in FIG. 2(a), the electrode section 12 is provided with land electrodes 13 and wiring 16.

The land electrodes 13 are electrodes for connecting the light-emitting module 1 to an external conducting wire (or external wiring or an external device) that is not depicted. The land electrodes 13 connect to the external conducting wire (or the external wiring or the external device) that is not depicted via a conductive contact section 62 (see FIG. 1(b)) in the holder 4, and thereby supplies power to the light-emitting module 1.

The land electrodes 13 are provided with an anode electrode 14 and a cathode electrode 15. The anode electrode 14 and the cathode electrode 15 are provided opposing each other via the light-emitting section 30 as depicted in FIG. 2(a). In the present embodiment, the anode electrode 14 and the cathode electrode 15 are arranged in corner portions on a diagonal line (for example, the bottom left and the top right in FIG. 2(a)), in the ceramic substrate 11.

The wiring 16 is a wiring pattern that connects the land electrodes 13 and the light-emitting section 30. The wiring 16 is provided with anode wiring 17 that is connected to the anode electrode 14, and cathode wiring 18 that is connected to the cathode electrode 15, The anode wiring 17 and the cathode wiring 18 are each formed in an arc shape that follows a portion of the outer periphery of the light-emitting section 30. The anode wiring 17 is connected to a terminal at the anode side of a wire 32 in the light-emitting section 30, and the cathode wiring 18 is connected to a terminal at the cathode side of a wire 32.

The land electrodes 13 comprise silver (Ag)-platinum (Pt), for example. On the other hand, the wiring 16 is formed around the light-emitting section 30 and comprises silver (Ag)/lead (Pd).

The electrode section 12 is formed on the ceramic substrate 11 by, for example, a screen printing method or the like.

It should be noted that, in FIG. 2(a), the anode electrode 14 and the cathode electrode 15 have a round shape (perfect circle shape). However, the shape of the anode electrode 14 and the cathode electrode 15 may be an elliptical shape or may be a polygon shape such as a square shape. Nevertheless, a perfect circle shape is preferable in order for the areas of these land electrodes 13 to be as small as possible for alignment with the conductive contact section 62 to be performed reliably.

Furthermore, the resistance elements 19 are protection elements that protect light-emitting elements 31 from an electrostatic breakdown voltage.

The resistance elements 19 are provided between and electrically connect mutually opposing end portions of the anode wiring 17 and the cathode wiring 18, in such a way as to be connected in parallel with a circuit in which a plurality of the light-emitting elements 31 are connected in series.

The resistance elements 19, for example, can be formed with printed resistors or can be formed with Zener diodes. In the case where the resistance elements 19 are formed with printed resistors, the resistance elements 19 are formed directly on the front surface of the ceramic substrate 11 by firing and thereby fixing printed paste-like resistance components. On the other hand, in the case where Zener diodes are used for the resistance elements 19, the Zener diodes are die-bonded on the wiring 16, and wire bonding is additionally performed.

<Resin Dam 20>

The resin dam 20 is a resin-made border (light-reflecting resin border) configured from light-reflecting resin. The resin dam 20 has a function to serve as a dam (a damming member) for preventing resin leakage from a sealing resin layer 33 in the light-emitting section 30. Furthermore, due to comprising light-reflecting resin as mentioned above, the resin dam 20 reflects light from the light-emitting section 30, and also prevents absorption of light by the wiring 16 and the resistance elements 19.

For example, alumina filler-containing silicone resin that includes alumina as light-diffusing filler is used for the light-reflecting resin used in the resin dam 20. However, the material for the resin dam 20 is not particularly limited as long as the material is insulating resin that includes light-reflecting resin.

The resin dam 20 is formed in an annular shape in plan view so as to surround a placement region (mounting region) in which all of the light-emitting elements 31 in the light-emitting section 30 are placed, in the ceramic substrate 11. However, the shape of the resin dam 20 is not limited thereto and may be a polygon shape such as a square shape, or may have any shape.

<Light-Emitting Section 30>

The light-emitting section 30 is provided with the light-emitting elements 31, the wires 32, and the sealing resin layer 33.

(Light-Emitting Elements 31)

The light-emitting elements 31 are mounted on the front surface of the ceramic substrate 11. Semiconductor light-emitting elements such as light-emitting diodes (LEDs) are used for the light-emitting elements 31. Blue light-emitting elements having a light emission peak wavelength of near 450 nm are used in the present embodiment. However, the light-emitting elements 31 are not limited thereto and, for example, ultraviolet (near ultraviolet) LED chips having a light emission peak wavelength of 390 nm to 420 nm may be used. An even greater improvement in light emission efficiency can be achieved by using ultraviolet (near ultraviolet) light-emitting elements for the light-emitting elements 31.

The light-emitting elements 31 are mounted on the front surface of the ceramic substrate 11. The light-emitting elements 31 are placed in a plurality of prescribed positions where a prescribed light emission amount can be satisfied in the front surface of the ceramic substrate 11.

(Wires 32)

The electrical connection of the light-emitting elements 31 is performed by wire bonding in which the wires 32 are used. Gold wires, for example, can be used as the wires 32. Wire bonding is a connection technology that is low-cost and has a high degree of freedom. Thus, costs incurred for expenses and processing can be mitigated. With a conductive connection implemented with these wires 32, it becomes possible to supply power to each of the light-emitting elements 31 from the land electrodes 13 (the anode electrode 14 and the cathode electrode 15).

(Sealing Resin Layer 33)

The sealing resin layer 33 is a layer that functions as the light-emitting section 30 and comprises a sealing resin that covers the region surrounded by the resin dam 20, and seals the light-emitting elements 31 and the wires 32 in this region.

The sealing resin layer 33 is formed by filling sealing resin into the region surrounded by the resin dam 20. Transparent resin such as transparent silicone resin is used as the sealing resin. It should be noted that the sealing resin may contain a phosphor. A phosphor that is excited by first-order light emitted from the light-emitting elements 31 and emits light having a longer wavelength than the first-order light is used as the aforementioned phosphor.

Due to the sealing resin containing the phosphor, the color of the output light of the light-emitting section 30 is a color obtained by mixing the color of the output light of the light-emitting elements 31 and the color of the excitation light of the phosphor. It should be noted that a configuration in which the sealing resin does not contain a phosphor may be implemented depending on the color of the output light of the light-emitting section 30.

It should be noted that the phosphor is not particularly limited and can be appropriately selected in accordance with a desired white chromaticity or the like. For example, a combination of a YAG yellow phosphor and an (Sr,Ca)AlSiN$_3$:Eu red phosphor, a combination of a YAG yellow phosphor and a CaAlSiN$_3$:Eu red phosphor, or the like can be used as a combination of a daytime white color and an electric-bulb color. Furthermore, a combination of an (Sr,Ca)AlSiN$_3$:Eu red phosphor and a Ca$_3$(Sc,Mg)$_2$Si$_3$O$_{12}$:Ce green phosphor or the like can be used as a high color rendering combination. Furthermore, other phosphor combinations may be used, and a configuration including only a YAG yellow phosphor as a pseudo white color may be used.

<<Schematic Configuration of Heat Sink 2>>

The heat sink 2 is provided in the form of a block as depicted in FIG. 1(b). The heat sink 2 is required to dissipate heat, and a material having high thermal conductivity is therefore preferably used for the heat sink 2.

Possible examples of the material for the heat sink 2 are metal such as aluminum, iron, or copper, or a ceramic material such as aluminum nitride, which have high thermal conductivity. Aluminum is preferred from thereamong from the point of the balance between performance and price.

It should be noted that, in the present embodiment, an aluminum plate that is 50-mm square and 3-mm thick is used for the heat sink 2.

Furthermore, screw holes 41 for fixing (screwing together) the external device 200, such as an external heat sink, and the heat sink 2 with screws 210 are provided in the heat sink 2. In the present embodiment, the screw holes 41 are provided in corner portions on diagonal lines (for example, the bottom left and the top right in FIG. 1(*a*)) in the heat sink 2.

FIG. 1(*a*) depicts a state in which the light-emitting device 100 is fixed (screwed) to the external device 200 with the screws 210 by way of the screw holes 41 provided in the heat sink 2.

It should be noted that although the external device 200 is not particularly limited, in the case where the light-emitting device 100 is to be used for an illumination device, a heat sink or the like that has the light-emitting device 100 attached thereto and constitutes a base section for the illumination device may be given as an example of the external device 200.

In the case where the external device 200 provided with the light-emitting device 100 in this way constitutes an illumination device, a heat sink to which the heat sink 2 is attached is used as a main heat sink, and the heat sink 2 is used as a sub-heat sink.

<<Schematic Configuration of Heat-Dissipating Sheet 3>>

The heat-dissipating sheet 3 is arranged between the heat sink 2 and the ceramic substrate 11 in the light-emitting module 1.

It is desirable that heat-dissipating sheet 3 arranged on the rear surface side of the light-emitting module 1 in this way be endowed with both flexibility and high thermal conductivity.

The heat-dissipating sheet 3 having flexibility satisfactorily follows the shapes of the surfaces of the ceramic substrate 11 and the heat sink 2 that make contact with the heat-dissipating sheet 3.

To be specific, the surfaces of the ceramic substrate 11 and the heat sink 2 that make contact with the heat-dissipating sheet 3 (in other words, the front surface of the heat sink 2 and the rear surface of the ceramic substrate 11) are macroscopically flat. However, these contact surfaces, microscopically, have minute level differences due to local thickness variations and surface roughness in the ceramic substrate 11 and the heat sink 2. The heat-dissipating sheet 3 having flexibility is able to fill such minute spaces. Thus, thermal coupling can be ensured between the heat-dissipating sheet 3 and the heat sink 2 and light-emitting module 1.

Thus, for the heat-dissipating sheet 3, an Asker C hardness within the range of 5 to 40 and a thickness within the range of 0.1 to 0.5 mm are preferred, and an Asker C hardness within the range of 15 to 30 and a thickness within the range of 0.15 to 0.3 mm are particularly preferred.

If the Asker C hardness of the heat-dissipating sheet 3 exceeds 40, there is a risk of the shapes of the surfaces of the ceramic substrate 11 and the heat sink 2 that make contact with the heat-dissipating sheet 3 not being followed, and thermal resistance rising considerably.

On the other hand, if the Asker C hardness of the heat-dissipating sheet 3 is less than 5, there is a problem such as the heat-dissipating sheet 3 being too soft and there being a decline in handleability.

Furthermore, if the thickness of the heat-dissipating sheet 3 exceeds 0.5 mm, variation occurs in the amount of compression of the heat-dissipating sheet 3 in the case where there is in-plane variation in stress caused by the ceramic substrate 11. As a result, variation occurs in the length of the heat dissipation path within the plane of the ceramic substrate 11, and, as result, there is a risk of in-plane variation in thermal resistance occurring and it becoming problematic to implement an accurate thermal design.

On the other hand, when the thickness of the heat-dissipating sheet 3 is less than 0.1 mm, problems occur in that construction becomes difficult, there is a considerable decline in handleability, and so forth.

It should be noted that a low-siloxane type of heat-dissipating sheet that is 30 mm×35 mm and 0.3-mm thick is used as the heat-dissipating sheet 3 in the present embodiment.

It should be noted that the Asker C hardness is measured using an Asker C-type of durometer (a spring-type hardness meter) that is compliant with SRIS0101 (Standards of The Society of Rubber Science and Technology, Japan).

<<Schematic Configuration of Holder 4>>

Figure 3:
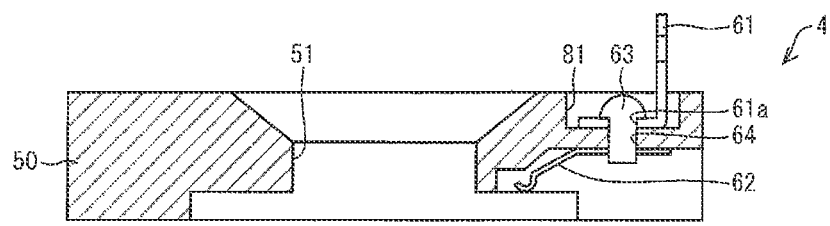
FIG. 3 is a cross-sectional view depicting a schematic configuration of a holder in the light-emitting device according to embodiment 1.

FIG. 3 is a cross-sectional view depicting a schematic configuration of the holder 4 in the light-emitting device 100.

The holder 4 is a cover member for attaching the light-emitting module 1 to the heat sink 2. Furthermore, a connector is provided in the holder 4 as a connection terminal (section that connects with the outside) that connects with the external conducting wire (or external wiring or an external device). Thus, the holder 4 is used as a connection tool (connector connection tool) that connects with the external conducting wire (or external wiring or an external device) by way of the connector, and electrically connects the outside (for example, the external conducting wire) and the light-emitting module 1 by way of the connector.

As depicted in FIG. 3, the holder 4 is provided with a ceramic plate 50 that constitutes the holder main body, a connection pin section 61 (connector), the conductive contact section 62, and a screw (bolt) 63.

The ceramic plate 50 is a plate of ceramic having an external shape that, in plan view, has a size and shape that are approximately the same as those of the heat sink 2. In the present embodiment, as depicted in FIG. 1(*a*), a 50 mm-square ceramic plate from which forming regions for the screw holes 41 provided in the heat sink 2 have been cut out is used for the ceramic plate 50.

A light-emitting surface opening 51 that exposes a light-emitting surface 34 of the light-emitting module 1 is formed in the central portion of the ceramic plate 50. As depicted in FIGS. 1(*a*) and (*b*), the light-emitting surface opening 51 is a through hole having approximately the same size as that of the light-emitting section 30 surrounded by the resin dam 20. With the light-emitting surface opening 51, when the light-emitting module 1 and the holder 4 are superimposed, the light-emitting section 30 of the light-emitting module 1 is exposed from the light-emitting surface opening 51. In other words, the holder 4 includes the light-emitting surface opening 51, which is an opening for outputting light, and covers a portion of the wiring substrate 10 formed by the ceramic substrate 11.

Furthermore, as depicted in FIG. 1(*a*), cutout sections 52 that expose the forming regions for the screw holes 41 provided in the heat sink 2 are formed in the four corners of the ceramic plate 50. Thus, using the screw holes 41, the heat sink 2 can be directly fixed to the external device 200 with the screws 210 without passing through the holder 4 (namely, without passing through the ceramic plate 50).

Furthermore, hexagonal screw holes for fixing are formed as screw holes 53 in the ceramic plate 50, in positions separate from the cutout sections 52. The screw holes 53 are screw holes for fixing (screwing together) the holder 4 and the heat sink 2, and are counterbored holes for embedding screws 71 such that the head portions of the screws 71 do not protrude further upward than the front surface of the ceramic plate 50 peripheral to the screw holes 53.

Undepicted screw holes for fixing (screwing together) the heat sink 2 to the external device 200 are formed in the heat sink 2 in positions that, in plan view, when the holder 4 and the heat sink 2 are superimposed, are the same as the positions where the screw holes 53 are formed. As depicted in FIGS. 1(*a*) and (*b*), the holder 4 and the heat sink 2 are fixed by the screws 71 by way of these screw holes in a state in which the light-emitting module 1 and the heat-dissipating sheet 3 are inserted between the holder 4 and the heat sink 2. As depicted in FIG. 1(*a*), the light-emitting module 1 and the heat-dissipating sheet are held between the holder 4 and the heat sink 2 and thereby mounted on the heat sink 2 without using screws.

Furthermore, the connection pin section 61, the conductive contact section 62, and the screw 63 are provided in the ceramic plate 50.

The connection pin section 61 is a connector (section that connects with the outside) formed in order to connect with the external conducting wire (or external wiring or an external device), which is not depicted.

A groove section 81 (groove-like section) that accommodates a portion of the connection pin section 61 and the screw 63 is provided in the vicinity of the light-emitting surface opening 51 in the front surface of the ceramic plate 50.

The connection pin section 61 has an L-shape, for example, as depicted in FIGS. 1(*a*) and (*b*), and is arranged such that one end portion thereof is positioned within the groove section 81 and the other end portion protrudes from the front surface of the ceramic plate 50.

As depicted in FIG. 1(*b*) and FIG. 3, an opening 61*a* is provided in the end portion of the connection pin section 61 that is inside the groove section 81. Furthermore, a screw hole 64 for fixing the screw 63 is provided in a bottom wall of the groove section 81. The opening 61*a* and the screw hole 64 are aligned and screwed with the screw 63, and thus the connection pin section 61 is fixed to the ceramic plate 50.

The groove section 81 is a counterbored hole in which the screw 63 is embedded such that the head portion of the screw 63 does not protrude further upward than the side walls of the groove section 81 (namely, further upward than the front surface of the ceramic plate 50 peripheral to the groove section 81). Consequently, the depth of the groove section 81 is formed deeper than the total thickness of the thickness of the head portion of the screw 63 and the thickness of the end portion of the connection pin section 61 inside the groove section 81.

The conductive contact section 62 is mechanically and electrically connected to the connection pin section 61 by the screw 63.

Furthermore, the conductive contact section 62 is a spring-like member in which the tip end near the land electrode 13 is bent in a direction away from the land electrode 13 on the front surface of the ceramic substrate 11.

By implementing the conductive contact section 62 in a spring-like form, the force (contact pressure) applied when the conductive contact section 62 and the land electrode 13 make contact can be suppressed to within a fixed range.

When the holder 4 and the light-emitting module 1 are superimposed, if the tip end of the conductive contact section 62 makes contact with the front surface of the land electrode 13 with a sharp shape, there is a risk of the front surface of the land electrode 13 being damaged. This is caused by the contact pressure not being suitable.

Hence, the conductive contact section 62 is implemented in a spring-like form to enlarge the contact area between the conductive contact section 62 and the land electrode 13, and the force applied to the land electrode 13 when the conductive contact section 62 and the land electrode 13 make contact is dispersed. Thus, a suitable contact pressure can be ensured, and damage to the front surface of the land electrode 13 can be prevented.

With regard to the conductive contact section 62, by superimposing the light-emitting module 1 and the holder 4, the conductive contact section 62 provided in the holder 4 and the land electrode 13 are superimposed facing each other in the vertical direction. The electrical connection between the conductive contact section 62 and the land electrode 13 that is implemented when the light-emitting module 1 and the holder 4 are superimposed is thereby ensured.

It should be noted that, as mentioned above, in the present embodiment, when the holder 4 and the heat sink 2 are fixed, screws are inserted so as to pass through the screw holes provided in each of the holder 4 and the heat sink 2 in a state in which the light-emitting module 1 is inserted therebetween. Thus, due to this screw fastening, the electrical connection between the conductive contact section 62 and the land electrode 13 is completed. The outside (the external conducting wire, for example) and the light-emitting module 1 are thereby electrically connected.

<<Effect>>

As described above, in the present embodiment, ceramic is used for each of the substrate on which the light-emitting section 30 is formed (namely, the substrate on which the light-emitting elements 31 are placed) and the holder main body.

As previously mentioned, ceramic has high rigidity and does not bend due to external stress. Furthermore, ceramic has a high dielectric breakdown voltage. With resin, there is no problem concerning the dielectric breakdown voltage but bending due to external stress does occur. On the other hand, with metal, bending due to external stress is largely dependent upon the shape and thickness of the metal. Thus, the suppression effect of metal regarding bending due to external stress is greater than that of resin but inferior to that of ceramic. Furthermore, with metal, there are absolutely no expectations regarding the dielectric breakdown voltage.

Thus, for example, the substrate easily deforms when a resin-made substrate is used for the substrate on which the light-emitting section 30 is formed, and it becomes difficult to ensure insulation properties when a metal-made substrate is used. However, such problems do not occur with a ceramic-made substrate. Thus, ceramic is the most suitable as the material for the substrate on which the light-emitting section 30 is formed.

Furthermore, ceramic has high rigidity and does not deform due to screw stress. Thus, the holder 4, in which the holder main body comprises the ceramic plate 50, does not deform due to screw stress even when the holder 4 and the heat sink 2 are fixed by screw fastening. Thus, the ceramic substrate 11 inserted between the holder 4 and the heat sink 2 does not break due to deformation of the holder 4.

Furthermore, because ceramic has high insulation properties, in the case where the light-emitting device 100 is to be used for an illumination device, for example, it is possible to easily attain high insulation properties, which is an essential requirement for an illumination device.

Furthermore, ceramic exhibits very little expansion/contraction due to thermal changes. Thus, in the case where ceramic is used for each of the substrate on which the light-emitting section 30 is formed and the holder main body, it is possible to suppress both thermal deformation (expansion/contraction) of the substrate on which the light-emitting section 30 is formed and thermal deformation (expansion/contraction) of the holder main body. Thus, it is sufficient for the holder 4 and the heat sink 2 to be fixed with the screws 210 in two locations as depicted in FIG. 1(a).

Furthermore, in the case where a resin-made holder is used for the holder 4, there is a problem in that the holder 4 discolors/degenerates when exposed to light from the light-emitting section 30 for a long period of time, which consequently causes a decline in reflectance.

However, by selecting ceramic as the material for the holder 4 as in the present embodiment, it is possible to prevent discoloration/degeneration and a decline in reflectance of the holder 4. Thus, the holder 4 can be arranged in the vicinity of the light-emitting section 30.

Thus, according to the present embodiment, as depicted in FIGS. 1(a) and (b), a contact section 54 that makes contact with the front surface of the ceramic substrate 11, along the outer periphery of the light-emitting section 30 can be provided in the holder 4.

Thus, with the contact section 54 arranged along the outer periphery of the light-emitting section 30 in the holder 4, the region of the ceramic substrate 11 that is in the vicinity of the light-emitting section 30 can be pressed down toward the heat sink 2. Consequently, it becomes possible for the rear surface of the light-emitting section 30, which is a heat generation source, to be suitably adhered to the heat-dissipating sheet 3 even in the case where the heat-dissipating sheet 3 is provided between the ceramic substrate 11 and the holder 4 as in the present embodiment. Thus, it is possible to solve the problem of a lighting failure or the like caused by an excessive rise in temperature when the light-emitting device 100 is used for an illumination device, for example.

Although it is preferable that the contact section 54 be provided along the entire outer periphery of the light-emitting section 30, it should be noted that the contact section 54 does not always have to be provided along the entire periphery of the light-emitting section 30. In at least the region in which the contact section 54 is provided, as mentioned above, the rear surface of the light-emitting section 30 can be suitably adhered to the heat-dissipating sheet 3, and a rise in thermal resistance can be suppressed. Thus, an excessive rise in temperature does not occur, and a lighting failure of an illumination device in the case where the light-emitting device 100 is used for an illumination device can be avoided.

However, in order to improve heat dissipation and suitably adhere the rear surface of the light-emitting section 30 to the heat-dissipating sheet 3, it is preferable that the contact section 54 be provided along the entire outer periphery of the light-emitting section 30. Furthermore, for the same reason, it is more desirable that the contact section 54 be formed around the entirety of the peripheral edge section of the ceramic substrate 11 in plan view, such that the light-emitting section 30 is surrounded in plan view by the peripheral edge section.

As mentioned above, due to the heat-dissipating sheet 3 being provided between the ceramic substrate 11 and the holder 4, it is possible to improve heat dissipation even more, and it is also possible to facilitate material management and achieve stabilization of the application step compared to the case where grease or an adhesive is used as a heat-dissipating material. Furthermore, grease and adhesives generally have low electrical insulation properties. Thus, due to the heat-dissipating sheet 3 being provided between the ceramic substrate 11 and the holder 4, it is possible to ensure higher insulation properties than in the case where grease or an adhesive is used.

In addition, due to the substrate on which the light-emitting section 30 is formed and the holder main body each being formed of ceramic, a heat dissipation path for heat generated from the light-emitting section 30 can be provided not only at the heat sink 2 side but also at the holder 4 side. As a result, heat generated from the light-emitting section 30 can be dissipated to the outside from the holder 4.

The thermal conductivity of ceramic is approximately 10 times that of resin. Thus, heat generated from the light-emitting section 30 is thermally conducted from the ceramic substrate 11 to the ceramic plate 50 and, in addition, is thermally conducted to the heat sink 2 from not only the ceramic substrate 11 but also the ceramic plate 50, which has a greater contact area with the heat sink 2 than the ceramic substrate 11. Furthermore, because ceramic has a high emissivity, heat can be effectively radiated to external air from the front surface of the ceramic plate 50 (namely, the front surface of the holder 4) at the same time as the thermal conduction from the ceramic plate 50 to the heat sink 2. Thus, due to the substrate of the light-emitting module 1 and the holder 4 both being made of ceramic as mentioned above, the heat dissipation path can be enlarged considerably. As a result, heat dissipation can be improved considerably.

Consequently, according to the present invention, it is possible to realize a light-emitting device 100 having excellent reliability and heat dissipation properties.

Furthermore, in the present embodiment, the positions of the screw holes 53 through which the holder 4 and the heat sink 2 are fixed and the positions of the screw holes 41 through which the heat sink 2 and the external device 200 are fixed are formed in positions that are separate from each other (in other words, separate positions) in plan view.

Thus, according to the present embodiment, the holder 4 and the heat sink 2 can first be fixed, and the heat sink 2 and the external device 200 such as an external heat sink can then be fixed.

When the positions of the screw holes 53 through which the holder 4 and the heat sink 2 are fixed and the positions of the screw holes 41 through which the heat sink 2 and the external device 200 are fixed are provided in the same positions in plan view so as to communicate with each other, the holder 4, the heat sink 2, and the external device 200 are fixed all at once. In this case, screw fastening is carried out with respect to a thickness for which the thicknesses of each of the holder 4, the heat sink 2, and the external device 200 are combined, and the force applied for the screw fastening therefore increases. As a result, the screw stress increases, and the distortion of each member caused by the screw fastening therefore increases. Furthermore, it becomes difficult to align the conductive contact section 62 and the land electrode 13. In addition, twisting of the heat-dissipating sheet 3 also occurs.

However, by fixing the holder 4 and the heat sink 2, and then fixing the heat sink 2 and the external device 200 such as an external heat sink, the distortion that occurs when the holder 4, the heat sink 2, and the external device 200 are fixed with screws can be dispersed, and overall distortion can be suppressed. Furthermore, the alignment of the holder 4, the heat sink 2, and the external device 200 can be carried out easily compared to the case where the holder 4, the heat sink 2, and the external device 200 are fixed all at once. Furthermore, it becomes easy to align the conductive contact section 62 and the land electrode 13, and also the twisting of the heat-dissipating sheet 3 can be suppressed.

Furthermore, distortion of the holder 4 caused by screw stress can be prevented, and also breakage of the holder caused by variation in the work performed by the user can be avoided, and therefore it is no longer necessary for the user to manage the fixing screw torque for the holder 4 and the heat sink 2.

Consequently, it is possible to provide a light-emitting device 100 having good usability as well as excellent reliability and heat dissipation properties.

Furthermore, according to the present embodiment, the groove section 81, which accommodates a portion of the connection pin section 61 and the screw 63, is provided in a portion of the front surface of the ceramic plate 50 that constitutes the holder main body, and the screw 63 is provided within the groove section 81, namely, in a position lower than the rest of the front surface in the ceramic plate 50. Thus, the head portion of the screw 63 does not protrude further upward than the rest of the front surface of the ceramic plate 50. Thus, according to the present embodiment, as well as a satisfactory appearance being able to be implemented, satisfactory fixing can be performed without the screw 63 being caught on something and making erroneous contact, and usability can be further improved.

Furthermore, according to the present embodiment, by using ceramic for each of the substrate on which the light-emitting section 30 is formed (namely, the substrate on which the light-emitting elements 31 are placed) and the holder main body as previously mentioned, deformation and breakage of the substrate is suppressed/prevented. Furthermore, the holder 4 does not deform due to screw stress and, moreover, exhibits little thermal deformation (expansion/contraction). In addition, the holder 4 can be arranged in the vicinity of the light-emitting section 30. Consequently, by providing the groove section 81 on the front surface of the holder 4, and providing the connection pin section 61, which is a connection section for implementing an electrical connection between the light-emitting module 1 and the outside, and the screw 63 within the groove section 81, the electrical connection between the light-emitting module 1 and the outside can be implemented satisfactorily.

Modified Example

It should be noted that, in the present embodiment, as an example, a case has been described in which the connection pin section 61 is provided in the holder 4 as a connection section (connector) that connects with an external conducting wire (or external wiring or an external device). However, the present embodiment is not limited thereto, and a soldered section may be provided instead of the connection pin section 61.

Embodiment 2

If another embodiment of the present invention were to be described on the basis of FIGS. 4(a) and (b) and FIG. 5, it would be as follows.

It should be noted that, in the present embodiment, a description is given regarding differences with embodiment 1, and, for convenience of the description, members having functions that are the same as those of members described in embodiment 1 are denoted by the same reference signs as in embodiment 1 and descriptions thereof are omitted.

Furthermore, also in the present embodiment, as in embodiment 1, specific dimensions and shapes are described as examples with respect to some constituent elements for reference. However, as in embodiment 1, the present embodiment is also not limited to these specific dimensions and shapes.

Figure 4:
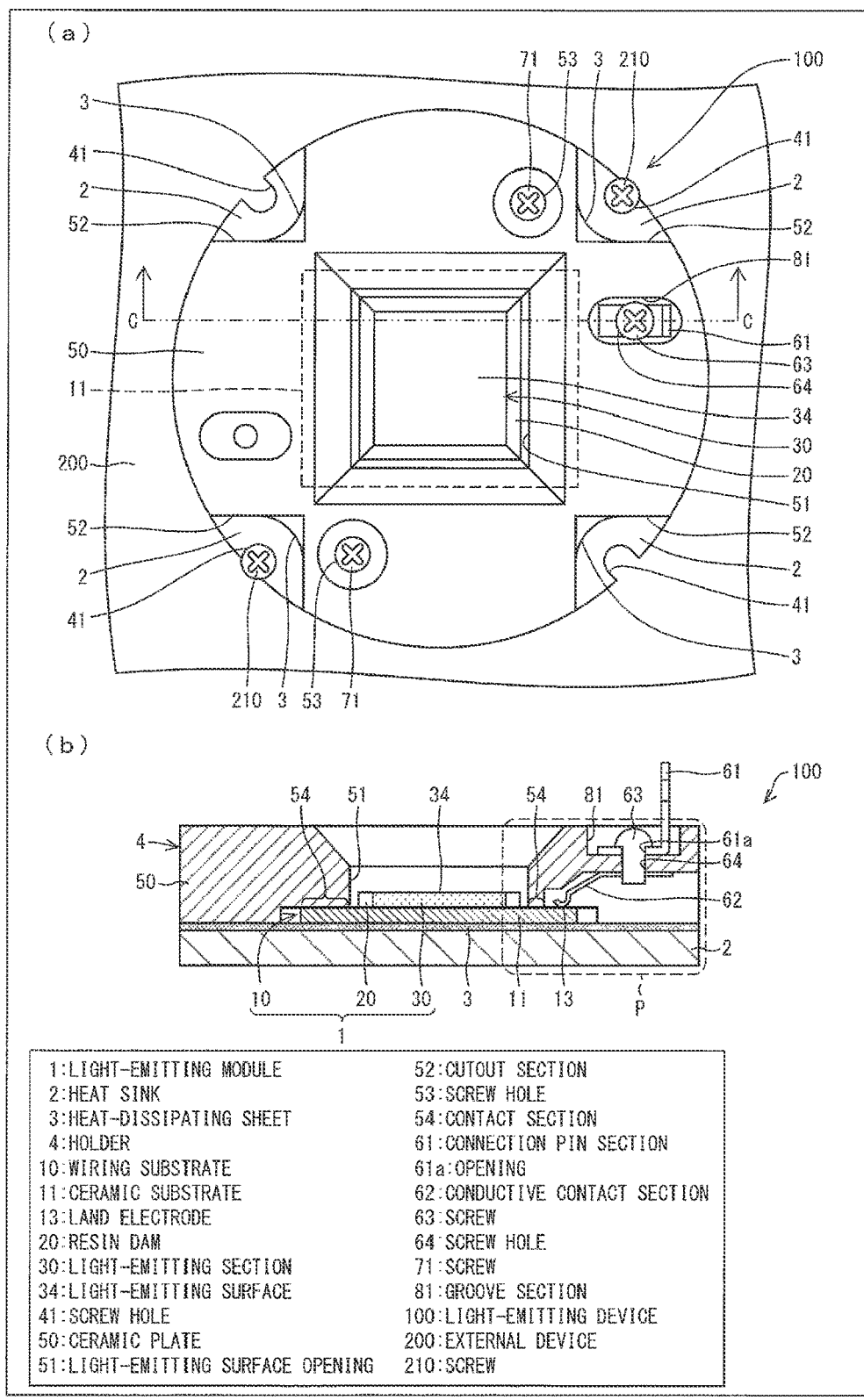
FIG. 4(a) is a plan view depicting a schematic configuration of when a light-emitting device according to embodiment 2 is placed on an external device, and (b) is a cross-sectional view along line C-C of the light-emitting device depicted in (a).

FIG. 4(a) is a plan view depicting a schematic configuration of when the light-emitting device 100 according to the present embodiment is placed on the external device 200, and FIG. 4(b) is a cross-sectional view along line C-C of the light-emitting device 100 depicted in FIG. 4(a). Furthermore, FIG. 5 is an enlarged view of a region P indicated by the dotted line in FIG. 4(b).

It should be noted that, in the present embodiment, as an example, a case is described in which, as an exemplary external shape of the light-emitting device 100, the heat sink 2 and the holder 4 have a circular external shape in plan view, and the light-emitting section 30 of the light-emitting module 1 has a square external shape in plan view.

In the present embodiment, whereas the heat sink 2 has a circular shape having a diameter of 60 mm, the resin dam 20 formed on the ceramic substrate 11 has a square shape, and therefore the light-emitting section 30 has a square shape. Furthermore, the ceramic plate 50 is implemented as a ceramic plate having a size and shape approximately the same as that of the heat sink 2, and in which, in plan view, the cutout sections 52 are provided in forming regions for the screw holes 41 provided in the heat sink 2. It should be noted that the screw holes 41 are provided, in plan view, on lines extending from the four corners of the light-emitting section 30, as depicted in FIG. 4(a).

<<Heat-Dissipating Sheet 3>>

In the light-emitting device 100 according to the present invention, as depicted in FIGS. 4(a) and (b), the heat-dissipating sheet 3 is formed up to below the screw 63 that fixes the conductive contact section 62 to the holder 4 and the connection pin section 61. It is thereby possible to gain creepage distance along the front surface of the insulator. According to the present embodiment, the creepage distance (distance along the front surface of the insulator) in the directions in which the holder 4, the connection pin section 61, and the conductive contact section 62 are joined as depicted in FIG. 5 is indicated by d1+d2+d3+d4, and the creepage distance is also extended by the amount by which d3 is extended further than in embodiment 1.

Figure 5:
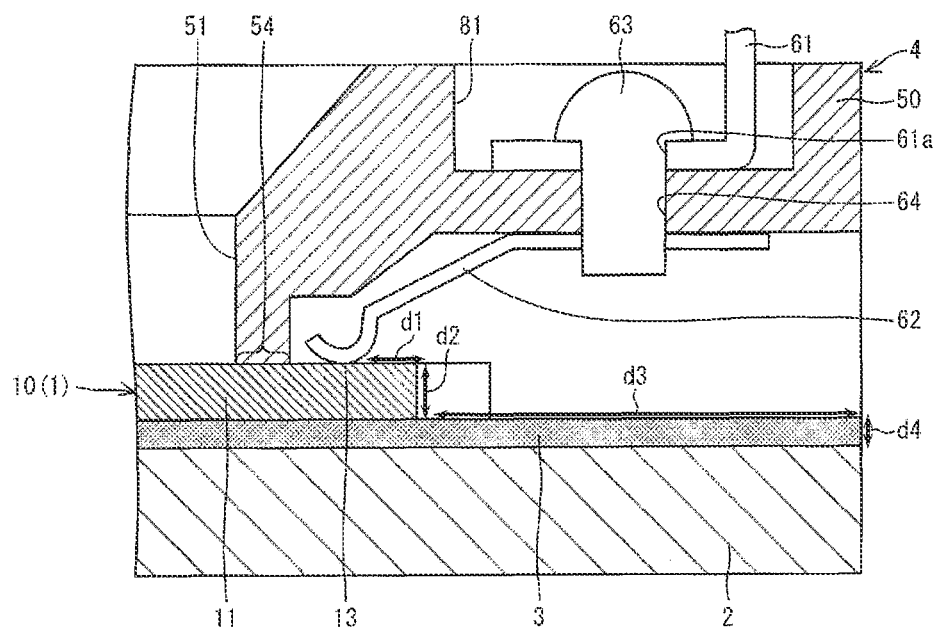
FIG. 5 is an enlarged view of a region P indicated by the dotted line in FIG. 4(b).

Furthermore, in the light-emitting device 100, as depicted in FIG. 5, in plan view, the external shape of the heat-dissipating sheet 3 may be formed larger than the external shape of the holder 4, and a portion of the heat-dissipating sheet 3 may protrude further outward than the holder 4. Twisting of the edge portion (corner portion, for example) of the heat-dissipating sheet 3 can thereby be prevented.

Embodiment 3

If yet another embodiment of the present invention were to be described on the basis of FIGS. 6(a) and (b) to FIG. 8, it would be as follows.

It should be noted that, in the present embodiment, a description is given regarding differences with embodiment 1, and, for convenience of the description, members having functions that are the same as those of members described in embodiment 1 are denoted by the same reference signs as in embodiment 1 and descriptions thereof are omitted.

Furthermore, also in the present embodiment, as in embodiment 1, specific dimensions and shapes are described as examples with respect to some constituent elements for reference. However, as in embodiment 1, the present embodiment is also not limited to these specific dimensions and shapes.

Figure 6:
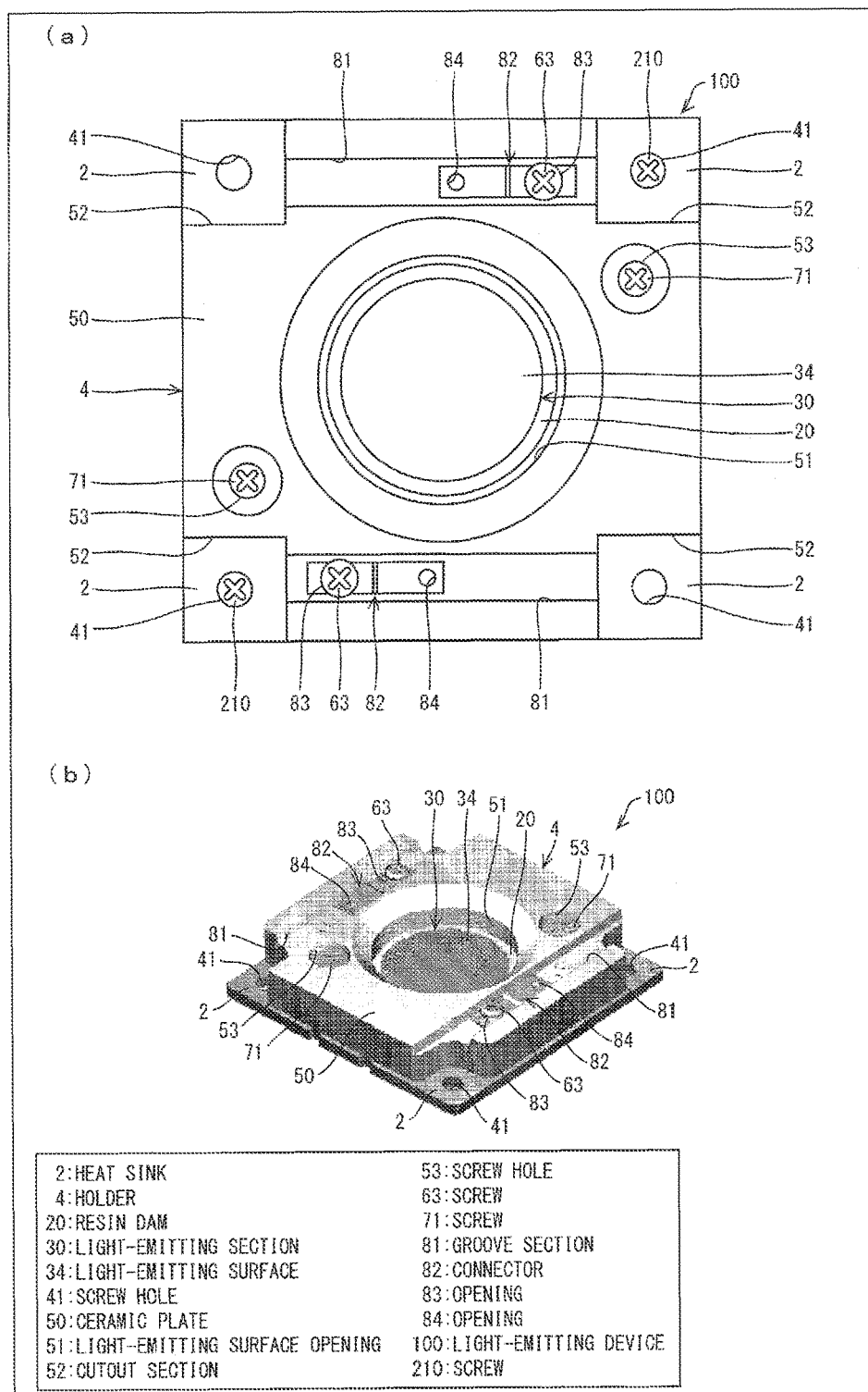
FIG. 6(a) is a plan view depicting a schematic configuration of a light-emitting module according to embodiment 3, and (b) is a perspective view depicting the schematic configuration of the light-emitting device depicted in (a).

FIG. 6(a) is a plan view depicting a schematic configuration of the light-emitting device 100 according to the present embodiment, and FIG. 6(b) is a perspective view depicting the schematic configuration of the light-emitting device 100 depicted in FIG. 6(a).

Figure 7:
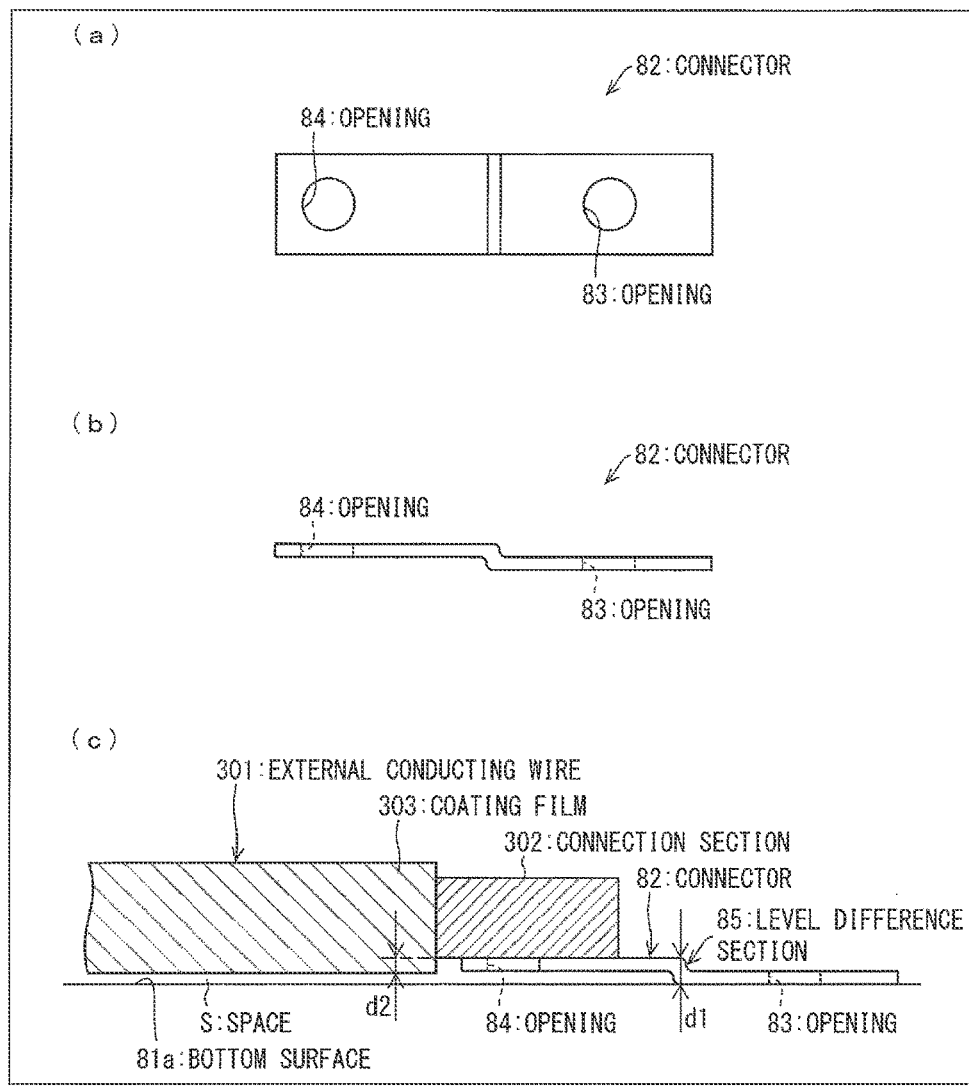
FIG. 7(a) is a plan view depicting a schematic configuration of a connector in the light-emitting device according to embodiment 3, (b) is a side view depicting the schematic configuration of the connector depicted in (a), and (c) is a main section cross-sectional view of the light-emitting device according to embodiment 3, depicting a state in which an external conducting wire is connected to the connector depicted in (a).

FIG. 7(a) is a plan view depicting a schematic configuration of a connector 82 in the light-emitting device 100 according to the present embodiment, FIG. 7(b) is a side view depicting the schematic configuration of the connector 82 depicted in FIG. 7(a), and FIG. 7(c) is a main section cross-sectional view of the light-emitting device 100 according to the present embodiment, depicting a state in which an external conducting wire 301 is connected to the connector 82 depicted in FIG. 7(a).

Figure 8:
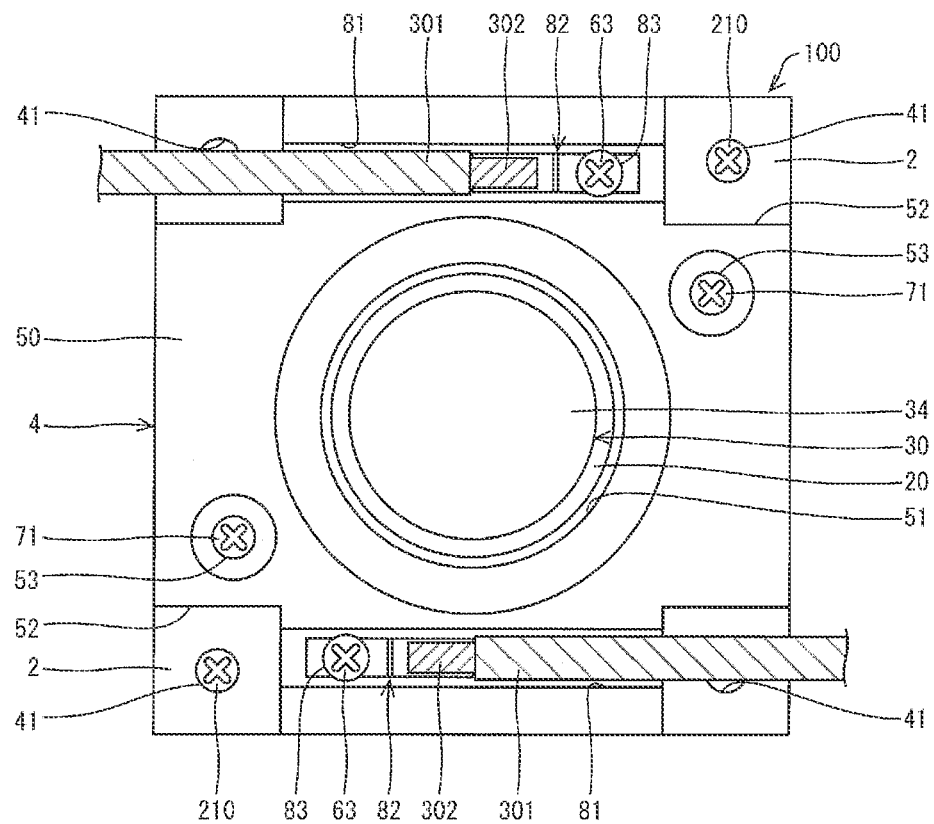
FIG. 8 is a plan view depicting a state in which external conducting wires are connected to connectors in the light-emitting device according to embodiment 3.

FIG. 8 is a plan view depicting a state in which external conducting wires 301 are connected to connectors 82 in the light-emitting device 100 according to the present embodiment.

It should be noted that, in the present embodiment, as an example, a case is described in which soldered sections are provided in the holder 4 as connection sections (the connectors 82) that connect with the external conducting wires 301 (or external wiring), and also the solder connection between the connectors 82 and the external conducting wires 301 is implemented within groove sections 81 provided in the holder 4.

<<Groove Sections 81>>

As depicted in FIGS. 6(a) and (b), in the light-emitting device 100 according to the present embodiment, groove sections 81 having a size with which the connectors 82, screws 63, and a portion of the external conducting wires 301 connected to the connectors 82 are accommodated therein are provided as the aforementioned groove sections 81 in the vicinity of the light-emitting surface opening 51 in the front surface of the ceramic plate 50 that constitutes the holder main body.

Specifically, in the present embodiment, in order for a portion of the external conducting wires 301 to be accommodated within the groove sections 81, two groove sections 81 are formed along two opposing edges of the ceramic plate 50 so as to connect two opposing cutout sections 52 from among four cutout sections 52 provided in the four corners of the ceramic plate 50.

It should be noted that, in the light-emitting device 100 depicted in FIGS. 6(a) and (b), the positions of the screw holes 53 for fixing the screws 71 and the fixing positions of the screws 63 are different from in the light-emitting device 100 depicted in FIG. 1(a). However, the positions of the screw holes 53 and the fixing positions of the screws 63 are not particularly limited and may be provided in the same positions as in the light-emitting device 100 depicted in FIG. 1(a).

Furthermore, in the present embodiment, two groove sections 81 are formed in the front surface of the ceramic plate 50 in the same way as in embodiment 1. However, the number of the groove sections 81 is not particularly limited and one or three or more may be formed as long as the number thereof is appropriately set in accordance with the number of external conducting wires 301 to be connected.

Furthermore, in the present embodiment, the depth of the groove sections 81 is 2 mm and the width of the groove sections 81 is 5 mm. However, the depth and width of the groove sections 81 are not particularly limited as long as they are appropriately set in accordance with the diameter of the external conducting wires 301, the total thickness of the thickness of the head portion of the screws 63 and the thickness of the connectors 82, and the like such that the head portion of the screws 63 and the external conducting wires 301 do not protrude further upward than the sidewalls of the groove sections 81.

<<Connectors 82>>

In the present embodiment, as depicted in FIGS. 7(a) to (c), connectors for soldering are implemented as the connectors 82, in which a level difference is provided in a middle portion as a result of the middle portion being bent in two locations so that there is a difference in height between one end portion side and the other end portion side.

Two openings 83 and 84 are provided in the connectors 82. As depicted in FIGS. 6(a) and (b), the opening 83 provided in one end portion side in the connectors 82 is used as a screw hole for fixing a screw 63. Furthermore, the opening 84 provided in the other end portion side in the connectors 82 is used as an opening for a solder connection between a connection section 302 (connection terminal) of the external conducting wires 301 depicted in FIG. 8 and the ceramic plate 50.

<<Connection Between Light-Emitting Module 1 and External Conducting Wires 301>>

In the present embodiment, the connection sections 302 of the external conducting wires 301 and the connectors 82 are solder-connected at the end portions where the opening 84 is formed, and also, as in embodiment 1, the connectors 82 and conductive contact sections 62 (see FIG. 1(b)) are mechanically and electrically connected with the screws 63, thereby electrically connecting the outside (the external conducting wires 301, for example, or external wiring or the like) and the light-emitting module 1.

At this time, the connection sections 302 of the external conducting wires 301 are solder-connected to the front surface of the ceramic plate 50 via the openings 84, and are thereby strongly adhered and fixed to the front surface of the ceramic plate 50 by way of the connectors 82 due to the infiltration of the solder.

Furthermore, in the present embodiment, as depicted in FIG. 7(c), the connectors 82 are bent to form a level difference section 85, which connects a lower-level side (where the opening 83 is formed) and an upper-level side (where the opening 84 is formed) of the connectors 82, such that the height d1 of the level difference section 85 is greater than the thickness 2d of a coating film 303 of the external conducting wires 301. Thus, the thickness of the lower-level side and the thickness of the upper-level side of the connectors 82 are equal.

It should be noted that, here, the height d1 of the level difference section 85 is equal to the distance from the bottom surface 81a of the groove sections 81 to the front surface on the upper-level side of the connectors 82, which is the front surface with which the external conducting wires 301 makes contact. Furthermore, the thickness of the coating film 303 of the external conducting wires 301 is equal to the distance from the front surface of the connection section 302 of the external conducting wires 301 to the front surface of the coating film 303.

Thus, according to the present invention, as depicted in FIG. 7(c), a space S is formed between the external conducting wires 301 accommodated within the groove sections 81 and the bottom surface 81a of the groove sections 81 in a state in which the connection sections 302 of the external conducting wires 301 and the connectors 82 are connected.

In this way, according to the present invention, by using the connectors 82 having a level difference between one end portion and the other end portion, the external conducting wires 301 do not make contact with the bottom surface 81a of the groove sections 81, and, when the external conducting wires 301 are solder-fixed to the connectors 82, heat does not escape to the holder 4. Thus, according to the present embodiment, the time required for solder-fixing can be shortened, and also solder-fixing can be carried out reliably and the fixing strength can be increased.

<<Effect>>

According to the present embodiment, due to the groove sections 81 being provided in a portion of the front surface of the ceramic plate 50 that constitutes the main body of the holder 4 as mentioned above, and the connectors 82, which are sections that connect with the outside (the external conducting wires 301, for example), being provided within the groove sections 81, it is possible to suppress or prevent the screws 63 and the external conducting wires 301 protruding further upward than the front surface of the ceramic plate 50 peripheral to the groove sections 81.

Consequently, according to the present invention, a satisfactory appearance can be achieved. Furthermore, it is possible to mitigate or prevent the screws 63 and the external conducting wires 301 being caught on something, and to also implement satisfactory fixing.

Thus, according to the present invention, it is possible to provide a light-emitting device 100 having good usability.

In particular, according to the present invention, as mentioned above, by setting the depth and width of the groove sections 81 such that the head portions of the screws 63 and the external conducting wires 301 do not protrude further upward than the sidewalls of the groove sections 81, the external conducting wires 301, the screws 63, and the solder used for soldering the external conducting wires 301 can be accommodated within the groove sections 81. As result, for example, the top surface (front surface) of the holder 4 and the height of the external conducting wires 301 including the solder are able to be approximately the same height. In this case, the appearance is able to be further improved. Furthermore, the risk of the connectors 82, the external conducting wires 301, the connection sections between the external conducting wires 301 and the solder, or the like becoming caught on something and making erroneous contact can be further mitigated. Thus, the fixing of the external conducting wires 301 can be made stronger, and also the connection of the connectors 82 and the external conducting wires 301 can be carried out more easily.

Furthermore, according to the present embodiment, by using ceramic for each of the substrate on which the light-emitting section 30 is formed (namely, the substrate on which the light-emitting elements 31 are placed) and the holder main body, as described in embodiment 1, deformation and breakage of the substrate is suppressed/prevented. Furthermore, the holder 4 does not deform due to screw stress and, moreover, exhibits little thermal deformation (expansion/contraction). In addition, the holder 4 can be arranged in the vicinity of the light-emitting section 30. Consequently, by providing the groove sections 81 in a portion of the front surface of the holder 4, and providing the connectors 82, which are connection sections for implementing an electrical connection between the light-emitting module 1 and the outside, and the screws 63 within the groove sections 81, the electrical connection between the light-emitting module 1 and the outside can be implemented satisfactorily.

Modified Example

It should be noted that, in the present embodiment, as an example, a case has been described in which the groove sections 81, which accommodate the connectors 82, the screws 63, and a portion of the external conducting wires 301 (or external conducting wire) connected to the connectors 82, are provided in a portion of the front surface of the ceramic plate 50 in the light-emitting device 100 according to embodiment 1. However, the present embodiment is not limited thereto and may have a configuration in which the groove sections 81, which accommodate the connectors 82, the screws 63, and a portion of the external conducting wires 301 connected to the connectors 82, are provided in a portion of the front surface of the ceramic plate 50 in the light-emitting device 100 according to embodiment 2. Needless to say the effect described in the present embodiment can thereby be obtained in addition to the effects described in embodiments 1 and 2.

Furthermore, in the present embodiment, a configuration is implemented in which, in order to accommodate a portion of the external conducting wires 301 within the groove sections 81, the groove sections 81 are formed so as to connect two of the cutout sections 52, and both end portions in the longitudinal direction of the groove sections 81 are thereby open (open). However, the present embodiment is not limited thereto and may have a configuration in which one end portion is closed, specifically, the end portion where the connectors 82 are formed in the groove sections 81, and only the other end portion is open.

Furthermore, in the present embodiment, as an example, a case is described in which ceramic is used for the substrate on which the light-emitting section 30 is formed (namely, the substrate on which the light-emitting elements 31 are placed) and the holder main body. As described in embodiment 1, this is preferable due to the synergistic effect obtained from both the substrate on which the light-emitting section 30 is formed and the holder main body being formed of ceramic.

However, the present embodiment is not limited thereto, and at least one of the substrate on which the light-emitting section 30 is formed and the holder main body may be formed of ceramic. Due to at least one of the substrate on which the light-emitting section 30 is formed and the holder main body being formed of ceramic, at least one of the following effects described in embodiment 1 can be obtained in addition to the effect described in the present embodiment: the effect due to using the ceramic substrate 11 for the substrate on which the light-emitting section 30 is formed; and the effect due to using the ceramic plate 50 for the holder main body.

[Summary]

A light-emitting device 100 according to aspect 1 of the present invention is provided with: a light-emitting module 1 in which a light-emitting section 30 is provided on a substrate (a ceramic substrate 11); a heat sink 2; a holder 4 for attaching the light-emitting module 1 to the heat sink 2; and a heat-dissipating sheet 3 provided between the substrate and the heat sink 2, the substrate and the main body of the holder 4 (a holder main body, a ceramic plate 50) being formed of ceramic.

Ceramic has high rigidity, does not bend due to external stress, and has a high dielectric breakdown voltage. Thus, by using the ceramic substrate 11 for the aforementioned substrate, deformation of the substrate can be suppressed, and also insulation properties of the substrate can be easily ensured.

Furthermore, ceramic has high rigidity and does not deform due to screw stress. Thus, even when the holder 4, in which the holder main body comprises the ceramic plate 50, and the heat sink 2 are fixed by screw fastening, the holder 4 does not deform due to screw stress, and the ceramic substrate 11 does not break due to deformation of the holder 4.

Furthermore, ceramic exhibits very little expansion/contraction due to thermal changes. Thus, in the case where ceramic is used for each of the substrate on which the light-emitting section 30 is formed and the holder main body, it is possible to suppress both thermal deformation (expansion/contraction) of the substrate on which the light-emitting section 30 is formed and thermal deformation (expansion/contraction) of the holder main body.

Furthermore, ceramic has electrical insulation properties, high light reflectivity, and high thermal conductivity. Thus, by selecting ceramic as the material for the holder 4, it is possible to prevent discoloration/degeneration of the holder 4 and a decline in reflectance, and therefore the holder 4 can be arranged in the vicinity of the light-emitting section 30.

Thus, the rear surface of the light-emitting section 30, which is a heat generation source, can be suitably adhered to the heat-dissipating sheet 3 even in the case where the heat-dissipating sheet 3 is provided between the ceramic substrate 11 and the holder 4 as mentioned above. Thus, it is possible to solve the problem of a lighting failure or the like caused by an excessive rise in temperature when the light-emitting device 100 is used for an illumination device, for example.

Furthermore, due to the heat-dissipating sheet 3 being provided between the ceramic substrate 11 and the holder 4, it is possible to improve heat dissipation, and it is also possible to facilitate material management, achieve stabilization of the application step, and ensure high insulation properties compared to the case where grease or an adhesive is used as a heat-dissipating material.

In addition, due to the substrate on which the light-emitting section 30 is formed and the holder main body each being formed of ceramic, a heat dissipation path for heat generated from the light-emitting section 30 is able to be provided not only at the heat sink 2 side but also at the holder 4 side. As a result, heat generated from the light-emitting section 30 can be dissipated to the outside from the holder 4.

Thus, according to the aforementioned configuration, it is possible to realize a light-emitting device 100 having excellent reliability and heat dissipation properties.

With regard to a light-emitting device 100 according to aspect 2 of the present invention, in the aforementioned aspect 1, the holder 4 may have a contact section 54 that makes contact with the front surface of the substrate, along the outer periphery of the light-emitting section 30.

According to the aforementioned configuration, the ceramic substrate 11 is pressed toward the heat sink 2 by the contact section 54. As a result, the rear surface of the light-emitting section 30, which is a heat generation source, can be suitably adhered to the heat-dissipating sheet 3 even in the case where the heat-dissipating sheet 3 is provided between the ceramic substrate 11 and the holder 4. Consequently, according to the aforementioned configuration, it is possible to solve the problem of a lighting failure or the like caused by an excessive rise in temperature when the light-emitting device 100 is used for an illumination device, for example.

With regard to a light-emitting device 100 according to aspect 3 of the present invention, in the aforementioned aspect 2, the contact section 54 is formed around the entirety of a peripheral edge section of the ceramic substrate 11 in plan view, such that the light-emitting section 30 is surrounded in plan view by the peripheral edge section.

According to the aforementioned configuration, in the peripheral edge section of the ceramic substrate 11 in plan view, the rear surface of the light-emitting section 30 can be suitably adhered to the heat-dissipating sheet 3, around the entirety of the peripheral edge section. Thus, heat dissipation can be improved even more.

With regard to a light-emitting device 100 according to aspect 4 of the present invention, in any one of the aforementioned aspects 1 to 3, screw holes 41 for fixing the heat sink 2 to an external device 200 with screws 210 are formed in the heat sink 2, in positions separate from screw holes 53 for fixing the heat sink 2 and the holder 4 with screws 71.

According to the aforementioned configuration, it is not necessary to fix the holder 4, the heat sink 2, and the external device 200 all at once as in the case where the screw holes 41 and the screw holes 53 are provided in the same positions in plan view so as to communicate with each other. Thus, compared to the case where screw fastening is carried out with respect to a thickness for which the thicknesses of each of the holder 4, the heat sink 2, and the external device 200 are combined, the force applied for screw fastening can be reduced, and distortion of each member caused by the screw fastening can be suppressed. In addition, twisting of the heat-dissipating sheet 3 can be suppressed. Furthermore, it becomes easy to align each member.

Furthermore, deformation of the holder 4 can be prevented, and also breakage of the holder caused by variation in the work performed by the user can be avoided, and therefore it is no longer necessary for the user to manage the fixing screw torque for the holder 4 and the heat sink 2.

Consequently, according to the aforementioned configuration, it is possible to provide a light-emitting device 100 having good usability as well as excellent reliability and heat dissipation properties.

With regard to a light-emitting device 100 according to aspect 5 of the present invention, in any of the aforementioned aspects 1 to 4, the thickness of the heat-dissipating sheet 3 may be within the range of 0.1 to 0.5 mm, and the Asker C hardness of the heat-dissipating sheet 3 may be within the range of 5 to 40.

Furthermore, with regard to a light-emitting device 100 according to aspect 6 of the present invention, in the aforementioned aspect 5, the thickness of the heat-dissipating sheet 3 may be within the range of 0.15 to 0.3 mm, and the Asker C hardness of the heat-dissipating sheet 3 may be within the range of 15 to 30.

By implementing the configuration of the aforementioned aspect 5 or 6, the heat-dissipating sheet 3 can be made to reliably follow the shapes of the surfaces of the ceramic substrate 11 and the heat sink 2 that make contact with the heat-dissipating sheet 3. Thus, thermal coupling can be ensured among the heat-dissipating sheet 3, the heat sink 2, and the light-emitting module 1, and thermal resistance can be prevented from rising considerably. Furthermore, even when there is in-plane variation in stress due to the ceramic substrate 11, variation is not liable to occur in the amount of compression of the heat-dissipating sheet 3, and in-plane variation in thermal resistance can be suppressed.

With regard to a light-emitting device 100 according to aspect 7 of the present invention, in any of the aforementioned aspects 1 to 6, the external shape of the heat-dissipating sheet 3 may be formed larger than the external shape of the holder 4, and a portion of the heat-dissipating sheet 3 may protrude further outward than the holder 4.

Due to the external shape of the heat-dissipating sheet 3 being formed larger than the external shape of the holder 4, creepage distance (distance along the front surface of an insulator) can be gained.

Furthermore, at this time, due to a portion of the heat-dissipating sheet 3 being provided protruding further outward than the holder 4, the edge portion (corner portion, for example) of the heat-dissipating sheet 3 can be prevented from twisting.

With regard to a light-emitting device 100 according to aspect 8 of the present invention, in any of the aforementioned aspects 1 to 7, there may be at least one groove section 81 in a portion of the front surface of the holder 4, and a connection section (for example, a connection pin section 61 or a connector 82, and a screw 63) that electrically connects the light-emitting module 1 to the outside (for example, an external conducting wire 301 or external wiring or the like) may be provided within the groove section 81.

According to the aforementioned configuration, it is possible to suppress or prevent the connection section protruding further upward than the sidewalls of the groove section 81 (namely, further upward than the front surface of the holder 4 peripheral to the groove section 81).

Thus, a satisfactory appearance can be achieved. Furthermore, it is possible to mitigate or prevent the connection section being caught on something and making erroneous contact, and to also implement satisfactory fixing. Thus, usability can be further improved.

Furthermore, as previously mentioned, due to the substrate and the main body of the holder 4 being formed of ceramic, deformation and breakage of the substrate is suppressed/prevented, and also the holder 4 does not deform due to screw stress and also exhibits little thermal deformation (expansion/contraction). In addition, the holder 4 can be arranged in the vicinity of the light-emitting section 30. Consequently, by providing the connection section on the front surface of the holder 4, the electrical connection between the light-emitting module 1 and the outside can be implemented satisfactorily.

A light-emitting device 100 according to aspect 9 of the present invention is provided with: a light-emitting module 1 in which a light-emitting section 30 is provided on a substrate (ceramic substrate 11); and a holder 4 for attaching the light-emitting module 1 to a heat sink 2, there being at least one groove section 81 in a portion of the front surface of the holder 4, and a connection section (for example, a connection pin section 61 or a connector 82, and a screw 63) that electrically connects the light-emitting module 1 to the outside (for example, an external conducting wire 301 or external wiring or the like) being provided within the groove section 81.

According to the aforementioned configuration, due to the at least one groove section 81 being provided in a portion of the front surface of the holder 4, and the connection section that electrically connects the light-emitting module 1 to the outside being provided within the groove section 81, it is possible to suppress or prevent the connection section protruding further upward than the sidewalls of the groove section 81 (namely, further upward than the front surface of the holder 4 peripheral to the groove section 81).

Thus, a satisfactory appearance can be achieved. Furthermore, it is possible to mitigate or prevent the connection section being caught on something and making erroneous contact, and to also implement satisfactory fixing. Thus, usability can be further improved.

Consequently, according to the aforementioned configuration, it is possible to realize a light-emitting device 100 having excellent reliability.

With regard to a light-emitting device 100 according to aspect 10 of the present invention, in the aforementioned aspect 9, at least one of the substrate (the ceramic substrate 11) and the main body of the holder 4 (the holder main body, the ceramic plate 50) may be formed of ceramic.

As previously mentioned, ceramic has high rigidity, does not bend due to external stress, and has a high dielectric breakdown voltage. Thus, by using the ceramic substrate 11 for at least the aforementioned substrate, deformation of the substrate can be suppressed, and also insulation properties of the substrate can be easily ensured.

Furthermore, ceramic has electrical insulation properties, high light reflectivity, and high thermal conductivity. Thus, by selecting ceramic as the material for the holder 4, it is possible to prevent discoloration/degeneration of the holder 4 and a decline in reflectance, and therefore the holder 4 can be arranged in the vicinity of the light-emitting section 30.

Furthermore, ceramic exhibits very little expansion/contraction due to thermal changes. Thus, in the case where ceramic is used for each of the substrate on which the light-emitting section 30 is formed and the holder main body, it is possible to suppress both thermal deformation (expansion/contraction) of the substrate on which the light-emitting section 30 is formed and thermal deformation (expansion/contraction) of the holder main body.

In addition, due to the substrate and the holder main body each being formed of ceramic, a heat dissipation path for heat generated from the light-emitting section can be provided not only at the heat sink side but also at the holder side.

Furthermore, ceramic has high rigidity and does not deform due to screw stress. Thus, even when the holder 4, in which the holder main body comprises the ceramic plate 50, and the heat sink 2 are fixed by screw fastening, the holder 4 does not deform due to screw stress, and the ceramic substrate 11 does not break due to deformation of the holder 4.

Consequently, by providing the connection section on the front surface of the holder 4, the electrical connection between the light-emitting module 1 and the outside can be implemented satisfactorily.

With regard to a light-emitting device 100 according to aspect 11 of the present invention, in the aforementioned aspect 9 or 10, a heat sink 2 is additionally provided, and screw holes 41 for fixing the heat sink 2 to an external device 200 with screws 210 are formed in the heat sink 2, in positions separate from screw holes 53 for fixing the heat sink 2 and the holder 4 with screws 71.

According to the aforementioned configuration, it is not necessary to fix the holder 4, the heat sink 2, and the external device 200 all at once as in the case where the screw holes 41 and the screw holes 53 are provided in the same positions in plan view so as to communicate with each other. Thus, compared to the case where screw fastening is carried out with respect to a thickness for which the thicknesses of each of the holder 4, the heat sink 2, and the external device 200 are combined, the force applied for screw fastening can be reduced, and distortion of each member caused by the screw fastening can be suppressed. Furthermore, it becomes easy to align each member.

Furthermore, deformation of the holder 4 can be prevented, and also breakage of the holder caused by variation in the work performed by the user can be avoided, and therefore it is no longer necessary for the user to manage the fixing screw torque for the holder 4 and the heat sink 2.

Consequently, according to the aforementioned configuration, it is possible to provide a light-emitting device 100 having good usability as well as excellent reliability and heat dissipation properties.

With regard to a light-emitting device 100 according to aspect 12 of the present invention, in the aforementioned aspects 8 to 11, the connection section may be provided with: a connector (for example, a connection pin section 61 or a connector 82) that is connected to the outside (for example, an external conducting wire 301 or external wiring or the like); and a screw 63 that fixes the connector to the holder 4, and also electrically connects (for example, electrically connects via the conductive contact section 62) the connector to a power-supply electrode section (land electrodes 13) in the light-emitting module 1, and the groove section 81 may have a depth with which at least the head portion of the screw 63 does not protrude further upward than the sidewalls of the groove section 81.

According to the aforementioned configuration, the head portion of the screw 63 can be prevented from protruding further upward than the sidewalls of the groove section 81 (namely, further upward than the front surface of the holder 4 peripheral to the groove section).

Thus, a satisfactory appearance can be achieved. Furthermore, it is possible to mitigate or prevent the head portion of the screw 63 being caught on something and making erroneous contact, and to also implement satisfactory fixing. Thus, usability can be further improved.

With regard to a light-emitting device 100 according to aspect 13 of the present invention, in the aforementioned aspects 8 to 12, the groove section 81 may be formed so as to be able to accommodate a portion of an external conducting wire or wiring (for example, the external conducting wire 301 or external wiring or the like) that is electrically connected to the connection section, and also the groove section 81 may have a depth with which the external conducting wire or the wiring accommodated within the groove section 81 does not protrude further upward than the sidewalk of the groove section 81.

According to the aforementioned configuration, the external conducting wire or the wiring that is electrically connected to the connection section can be accommodated within the groove section 81, and also the external conducting wire or the wiring accommodated within the groove section 81 can be prevented from protruding further upward than the sidewalk of the groove section 81 (namely, further upward than the front surface of the holder 4 peripheral to the groove section).

Thus, a satisfactory appearance can be achieved. Furthermore, it is possible to mitigate or prevent the external conducting wire or the wiring accommodated within the groove section 81 being caught on something and making erroneous contact, and to also implement satisfactory fixing. Thus, usability can be further improved.

The present invention is not limited to the aforementioned embodiments, various alterations are possible within the scope indicated in the claims, and embodiments obtained by appropriately combining the technical means disclosed in each of the different embodiments are also included within the technical scope of the present invention. In addition, novel technical features can be formed by combining the technical means disclosed in each of the embodiments.

INDUSTRIAL APPLICABILITY

The present invention can be suitably used for an illumination device provided with a light-emitting device.

REFERENCE SIGNS LIST

1 Light-emitting module
2 Heat sink
3 Heat-dissipating sheet
4 Holder
10 Wiring substrate
11 Ceramic substrate (substrate)
12 Electrode section
13 Land electrode (power-supply electrode section)
14 Anode electrode
15 Cathode electrode
16 Wiring
17 Anode wiring
18 Cathode wiring
19 Resistance element
20 Resin dam
30 Light-emitting section
31 Light-emitting element
32 Wire
33 Sealing resin layer
34 Light-emitting surface
41 Screw hole
50 Ceramic plate
51 Light-emitting surface opening
52 Cutout section
53 Screw hole
54 Contact section
61 Connection pin section (connector)
61a Opening
62 Conductive contact section
63 Screw
64 Screw hole
71 Screw
81 Groove section
82 Connector
83 Opening
84 Opening
85 Level difference section
100 light-emitting device
200 External device
210 Screw
301 External conducting wire
302 Connection section
303 Coating film
S Space

The invention claimed is:

1. A light-emitting device, comprising:
a tight-emitting module in which a light-emitting section is provided on a substrate; and
a holder for attaching the light-emitting module to a heat sink,
there being at least one groove section in a portion of a front surface of the holder,
a connection section that electrically connects the light-emitting module to outside being provided within the groove section,
the connection section being provided with:
a connector that is connected to the outside; and
a screw that fixes the connector to the holder, and also electrically connects the connector to a power-supply electrode section in the light-emitting module, a conductive contact section being further provided, electrically connected to the power-supply electrode section due to being provided in a position that opposes the groove section in a rear surface of the holder and being superimposed on the power-supply electrode section in a vertically opposing manner, and also electrically connected to the connector by the screw, and the groove section being formed so as to be able to accommodate a portion of an external conducting wire or wiring that is electrically connected to the conductive contact section by way of the connection section.

2. The tight-emitting device according to claim 1, further comprising a heat-dissipating sheet provided between the substrate and the heat sink.

3. The light-emitting device according to claim 1, wherein the holder has a contact section that makes contact with a front surface of the substrate, along an outer periphery of the light-emitting section.

4. The light-emitting device according to claim 2, wherein a thickness of the heat-dissipating sheet is within a range of 0.1 to 0.5 mm, and an Asker C hardness of the heat-dissipating sheet is within a range of 5 to 40.

5. The light-emitting device according to claim 2, wherein,
in plan view, an external shape of the heat-dissipating sheet is formed larger than an external shape of the holder, and a portion of the heat-dissipating sheet protrudes further outward than the holder.

6. The light-emitting device according to claim 1, wherein at least one of the substrate and a main body of the holder is formed of ceramic.

7. The light-emitting device according to claim 1, further comprising a heat sink,
a screw hole for fixing the heat sink to an external device with a screw being formed in the heat sink, in a position separate from a screw hole for fixing the heat sink and the holder with a screw.

8. The light-emitting device according to claim 1, wherein the groove section has a depth with which at least a head portion of the screw does not protrude further upward than a sidewall of the groove section.

* * * * *